(12) United States Patent
Park et al.

(10) Patent No.: US 7,192,822 B2
(45) Date of Patent: Mar. 20, 2007

(54) METHOD OF FABRICATING CMOS TYPE SEMICONDUCTOR DEVICE HAVING DUAL GATES

(75) Inventors: Byung-Jun Park, Gyeonggi-do (KR); Joon-Mo Kwon, Gyeonggi-do (KR)

(73) Assignee: Samsung Electronics Co., Ltd., Suwon-si (KR)

( * ) Notice: Subject to any disclaimer, the term of this patent is extended or adjusted under 35 U.S.C. 154(b) by 2 days.

(21) Appl. No.: 11/225,914

(22) Filed: Sep. 13, 2005

(65) Prior Publication Data

US 2006/0068539 A1 Mar. 30, 2006

(30) Foreign Application Priority Data

Sep. 14, 2004 (KR) ...................... 10-2004-0073517

(51) Int. Cl.
*H01L 21/336* (2006.01)
(52) U.S. Cl. ...................... 438/197; 438/199; 438/201
(58) Field of Classification Search ................ 438/197, 438/199, 201, 279
See application file for complete search history.

(56) References Cited

U.S. PATENT DOCUMENTS 6,114,206 A 9/2000 Yu
6,166,413 A 12/2000 Ono
6,468,851 B1 10/2002 Ang et al.
6,967,379 B2 * 11/2005 Matsuo ...................... 257/369

* cited by examiner

*Primary Examiner*—Hsien-Ming Lee
(74) *Attorney, Agent, or Firm*—Marger Johnson & MzcCollom, P.C.

(57) ABSTRACT

According to some embodiments, methods of fabricating a complementary metal oxide semiconductor (CMOS) type semiconductor device having dual gates are provided. The method includes forming an insulated first gate electrode on the P-type well, and an insulated second initial gate electrode on the N-type well. A first lower interlayer insulating layer exposing a top surface of the first gate electrode is formed on the P-type well while a second lower interlayer insulating layer exposing a top surface of the second initial gate electrode is formed on the N-type well. P-type impurity ions are selectively implanted into the second initial gate electrode to form a second gate electrode. A first ion implantation mask pattern is formed over the first gate electrode while a second ion implantation mask pattern is formed over the second gate electrode. The second lower interlayer insulating layer is etched, using the second ion implantation mask pattern as an etch mask, to expose a top surface of the N-type well. P-type impurity ions are implanted into the N-type well, using the second ion implantation mask pattern as an ion implantation mask, to form second source and drain regions on both sides of the second gate electrode.

20 Claims, 7 Drawing Sheets

METHOD OF FABRICATING CMOS TYPE SEMICONDUCTOR DEVICE HAVING DUAL GATES

CROSS-REFERENCE TO RELATED APPLICATION

This application claims the benefit of Korean Patent Application No. 2004-73517, filed Sep. 14, 2004, the contents of which are hereby incorporated herein by reference in their entirety.

BACKGROUND OF THE INVENTION

1. Field of the Invention

The present invention relates to a method of fabricating a semiconductor device and, more particularly, to a method of fabricating a complementary metal oxide semiconductor (CMOS) type semiconductor device having dual polysilicon gates.

2. Description of the Related Art

The CMOS type semiconductor device is a device which has a P-channel MOS (PMOS) transistor and an N-channel MOS (NMOS) transistor disposed on one semiconductor substrate to perform complementary operations.

One method for implementing the CMOS type semiconductor device is a single gate technique. The single gate technique uses N-type doped polysilicon gate electrodes for the PMOS and NMOS transistors. This single gate technique has the advantage of low cost, however, adjusting the operating voltage Vt of the PMOS transistor is difficult.

Another method for implementing the CMOS type semiconductor device is a technique that uses a metal material for the gate of the transistor instead of polysilicon since the metal gate has better conductivity. However, the metal gate degrades the gate insulating layer due to metal ions, and this makes it hard to adjust the operating voltage Vt due to its fixed work function. As described above, in order to implement the CMOS type semiconductor device having the NMOS transistor and the PMOS transistor on a single chip, the operating voltage Vt of the NMOS transistor should be different from that of the PMOS transistor. As a result, a metal gate used in the NMOS transistor region should be different from that used in the PMOS transistor region, which complicates the manufacturing process.

A method of forming a CMOS type semiconductor device using a metal gate is disclosed in U.S. Pat. No. 6,468,851 B1 entitled "Method of fabricating CMOS device with dual gate electrode" to Ang, et al.

According to Ang, et al., an N-type polysilicon gate electrode is formed in the NMOS transistor region and a metal gate electrode is formed in the PMOS transistor region. Copper, aluminum, titanium nitride, or tungsten is used as the metal gate electrode. For example, in order to form a copper gate electrode, a dedicated copper facility is required and a technique that prevents the copper from diffusing is also required. This complicates the manufacturing process.

Another method for implementing the CMOS type semiconductor device is a dual polysilicon gate technique. The dual polysilicon gate technique is a technique which allows an N-type polysilicon gate electrode to be formed in the NMOS transistor region and a P-type polysilicon gate electrode to be formed in the PMOS transistor region.

FIGS. 1 and 2 are cross-sectional views illustrating some of the processing steps in fabricating a CMOS type semiconductor device having dual polysilicon gates in accordance with the prior art.

Referring to FIG. 1, field isolation layers 2 are formed on the semiconductor substrate 1 to define active regions. A P-type well 3 and an N-type well 4 are formed within the active regions. An NMOS gate insulating layer 7 and an NMOS gate electrode 9 are formed on the P-type well 3 which are sequentially stacked to cross over the P-type well 3. A PMOS gate insulating layer 8 and a PMOS gate electrode 10 are formed on the N-type well 4 which are sequentially stacked to cross over the N-type well 4. In this case, the gate electrodes 9 and 10 are formed of N-type doped polysilicon. Lightly doped impurity regions 5 and 6 are formed in upper regions of the P-type well 3 and the N-type well 4. Subsequently, spacers 11 are formed on sidewalls of the gate electrodes 9 and 10.

Referring to FIG. 2, N-type impurity ions are selectively implanted into the P-type well 3 to form NMOS source and drain regions 13. A photoresist pattern 15 covering a top surface of the P-type well 3 is formed on the semiconductor substrate 1 to expose a top surface of the N-type well 4. Subsequently, P-type impurity ions such as boron (B) are selectively implanted into the semiconductor substrate 1 using the photoresist pattern 15 as an ion implantation mask to form PMOS source and drain regions 18. At the same time, P-type impurity ions are also implanted into the PMOS gate electrode 10 to form a P-type doped PMOS gate electrode 10'.

Electronic products using semiconductor devices are in pursuit of small size, lightweight, and high performance, therefore semiconductor devices need to have high integration density, low operating voltage Vt, fast operating speed, and low power consumption. For high integration density, a transistor's gate, source and drain junctions, and interconnects should be made as small as possible. However, shrinking the size of the transistor creates several issues. For example, the electrical resistance of the gate electrode is increased when the gate electrode is reduced. This causes the transmission speed of an electrical signal applied to the gate electrode to slow down due to the resistance-capacitance (RC) delay time. Additionally, a short channel effect is created due to the reduced channel length. In order to minimize the short channel effect, the source and drain junction depth should be fabricated to be shallow and the gate insulating layer should be fabricated to be thin.

In this case, when the PMOS gate electrode 10' is fabricated to be thin and the PMOS gate insulating layer 8 is also fabricated to be thin, problems such as polysilicon depletion and boron penetration become more severe. This occurs because the solid solubility of boron (B) with respect to the polysilicon is typically low. Accordingly, the boron ions implanted into the PMOS gate electrode 10' penetrate the PMOS gate insulating layer 8 (which has been fabricated to be thin), thereby diffusing into a channel region of the PMOS transistor. When the boron penetration phenomenon becomes severe, a depletion region is formed within the PMOS gate electrode 10' near the PMOS gate insulating layer 8. The polysilicon depletion region generates additional capacitance which is connected in series to the capacitance of the PMOS gate insulating layer 8. As a result, the polysilicon depletion region increases the electrical equivalent thickness of the PMOS gate insulating layer 8. The increase of the electrical equivalent thickness means a decrease in the effective gate voltage. In the prior art using a thick gate insulating layer, the thickness of the polysilicon depletion region is relatively small compared to the effective thickness of the thick gate insulating layer, so that its effect is negligible. However, when a thin gate insulating layer is used, the decrease of the effective gate voltage due to polysilicon depletion creates a severe problem. In addition, the boron (B) ions diffused into the channel region of the PMOS transistor may lower the mobility of the charge carrier in the channel region and may form P-type impurity layers connecting the source to the drain within the channel region. This would make it hard to adjust the operating voltage Vt.

A method of forming a CMOS type semiconductor device using the dual gates is disclosed in U.S. Pat. No. 6,166,413 entitled "Semiconductor device having field effect transistors different in thickness of gate electrodes and process of fabrication thereof" to Ono.

According to Ono, un-doped polysilicon patterns are formed in NMOS and PMOS transistor regions, respectively. The un-doped polysilicon pattern in the NMOS transistor region is over etched to have a small thickness. Arsenic (As) ions are selectively implanted into the NMOS transistor region to form an N-type gate electrode and N-type source and drain regions. Subsequently, B ions are implanted into the PMOS transistor form a P-type gate electrode and P-type source and drain regions. As a result, the N-type gate electrode thickness is smaller than that of the P-type gate electrode. However, the P-type gate electrode is concurrently formed while the P-type source and drain regions are formed. When the P-type gate electrode and the P-type source and drain regions are concurrently formed, it is difficult to control the amount of implantation of the B ions. That is, when an excessive amount of B ions are implanted into all of the P-type gate electrode and the P-type source and drain regions, the boron penetration phenomenon may become severe. On the contrary, when an insufficient amount of B ions are implanted into all of the P-type gate electrode and the P-type source and drain regions, the junction characteristic of the P-type source and drain regions may be degraded.

In conclusion, continuing improvement is required for a technique of forming the P-type gate electrode and the N-type gate electrode.

SUMMARY

Embodiments of the invention provide a method of implanting impurity ions having concentrations different from each other into a gate electrode and source and drain regions of a PMOS transistor in a CMOS type semiconductor device.

In one aspect, the invention is directed to methods of fabricating a CMOS type semiconductor device having dual gates. These methods include preparing a semiconductor substrate having an isolation layer, a first conductivity type well, and a second conductivity type well. Subsequently, a first gate electrode is formed on the first conductivity type well to be insulated from and to cross the first conductivity type well, while a second initial gate electrode is formed on the second conductivity type well to be insulated from and to cross the second conductivity type well. A first lower interlayer insulating layer exposing a top surface of the first gate electrode is formed on the first conductivity type well, while a second lower interlayer insulating layer exposing a top surface of the second initial gate electrode is formed on the second conductivity type well. First conductivity type impurity ions are selectively implanted into the second initial gate electrode to form a second gate electrode. A first ion implantation mask pattern is formed above the first gate electrode while a second ion implantation mask pattern is formed above the second gate electrode. The first lower interlayer insulating layer is etched to expose a top surface of the first conductivity type well at both sides of the first gate electrode. Second conductivity type impurity ions are implanted into the first conductivity type well using the first ion implantation mask pattern as an ion implantation mask to form first source and drain regions at both sides of the first gate electrode. The second lower interlayer insulating layer is etched using the second ion implantation mask pattern as an etch mask to expose a top surface of the second conductivity type well at both sides of the second gate electrode. First conductivity type impurity ions are implanted into the second conductivity type well using the second ion implantation mask pattern as an ion implantation mask to form second source and drain regions at both sides of the second gate electrode.

The first conductivity type may be a P-type or an N-type, and the second conductivity type is opposite to the first conductivity type. That is, the second conductivity type is a P-type when the first conductivity type is an N-type, and the second conductivity type is an N-type when the first conductivity type is a P-type. And the P-type impurity ions may use boron (B) or boron fluoride ($BF_2$).

The first gate electrode and the second initial gate electrode may be formed of second conductivity type polysilicon layers. For example, the second conductivity type polysilicon layer may be an N-type polysilicon layer.

Exposing the top surface of the first gate electrode and the top surface of the second initial gate electrode may include simultaneously forming a first hard mask pattern on the first gate electrode, and a second hard mask pattern on the second initial gate electrode. Subsequently, it may further include forming a conformal etch stop layer on the entire surface of the semiconductor substrate having the first and second hard mask patterns. It may further include forming a first lower interlayer insulating layer on the first conductivity type well to expose the etch stop layer on the first hard mask pattern, while forming a second lower interlayer insulating layer on the second conductivity type well to expose the etch stop layer on the second hard mask pattern. Subsequently, it may further include etching the etch stop layer, the first hard mask pattern, and the second hard mask pattern. The etch stop layer, the first and second hard mask patterns may be formed of nitride layers. The first and second lower interlayer insulating layers may be formed of insulating layers such as a boron phosphorous silicate glass (BPSG) layer.

A silicidation process may be applied on the semiconductor substrate having the first gate electrode and the second gate electrode to form a first silicide layer on the first gate electrode and a second silicide layer on the second gate electrode. The silicide layers may act to allow the gate electrodes to have a good conductivity.

A width of the first ion implantation mask pattern may be formed to be larger than that of the first gate electrode while a width of the second ion implantation mask pattern may be formed to be larger than that of the second gate electrode. In addition, the first and second ion implantation mask patterns may be formed of nitride layers.

Exposing the top surface of the first conductivity type well may include forming a first ion implantation photoresist pattern for exposing a top surface of the first conductivity type well and covering a top surface of the second conductivity type well on the semiconductor substrate having the first lower interlayer insulating layer and the first ion implantation mask pattern. Subsequently, it may further include etching the first lower interlayer insulating layer using the first ion implantation photoresist pattern and the first ion implantation mask pattern as etch masks. In this case, a first insulating spacer formed of a portion of the first lower interlayer insulating layer and the etch stop layer may be formed at a sidewall of the first gate electrode.

Exposing the top surface of the second conductivity type well may include forming a second ion implantation photoresist pattern for covering a top surface of the first conductivity type well and exposing a top surface of the second conductivity type well on the semiconductor substrate having the second lower interlayer insulating layer and the second ion implantation mask pattern. Subsequently, it may further include etching the second lower interlayer insulating layer using the second ion implantation photoresist pattern and the second ion implantation mask pattern as etch masks. In this case, a second insulating spacer formed of a portion of the second lower interlayer insulating layer and the etch stop layer may be formed at a sidewall of the second gate electrode.

The implantation amount of the first conductivity type impurity ions for forming the second source and drain regions may be adjusted to be different from that of the first conductivity type impurity ions implanted when the second initial gate electrode is converted to the second gate electrode.

In another aspect, the invention is directed to a method of fabricating a CMOS type semiconductor device having dual gates. The method includes preparing a semiconductor substrate having a field isolation layer, a P-type well, and an N-type well. Subsequently, a first gate electrode is formed on the P-type well to be insulated from and to cross the P-type well, while a second initial gate electrode is formed on the N-type well to be insulated from and to cross the N-type well. A first lower interlayer insulating layer exposing a top surface of the first gate electrode is formed on the P-type well, while a second lower interlayer insulating layer exposing a top surface of the second initial gate electrode is formed on the N-type well. P-type impurity ions are selectively implanted into the second initial gate electrode to form a second gate electrode. A silicidation process is applied on the semiconductor substrate having the first gate electrode and the second gate electrode to form a first silicide layer on the first gate electrode and a second silicide layer on the second gate electrode. A first ion implantation mask pattern is formed above the first silicide layer while a second ion implantation mask pattern is formed above the second silicide layer. The first lower interlayer insulating layer is etched to expose a top surface of the P-type well at both sides of the first gate electrode. N-type impurity ions are implanted into the P-type well, using the first ion implantation mask pattern as an ion implantation mask, to form first source and drain regions on both sides of the first gate electrode. The second lower interlayer insulating layer is etched, using the second ion implantation mask pattern as an etch mask, to expose a top surface of the N-type well at both sides of the second gate electrode. P-type impurity ions are implanted into the N-type well using the second ion implantation mask pattern, as an ion implantation mask, to form second source and drain regions at both sides of the second gate electrode.

The implantation amount of the P-type impurity ions for forming the second source and drain regions may be adjusted to be different from that of the P-type impurity ions implanted when the second initial gate electrode is converted to the second gate electrode.

BRIEF DESCRIPTION OF THE DRAWINGS

The foregoing and other objects, features and advantages of the invention will be apparent from the description of a preferred embodiment of the invention, as illustrated by the accompanying drawings. The drawings are not necessarily to scale, with the drawings primarily being used to illustrate the principles of the invention.

DETAILED DESCRIPTION

Figure 1:
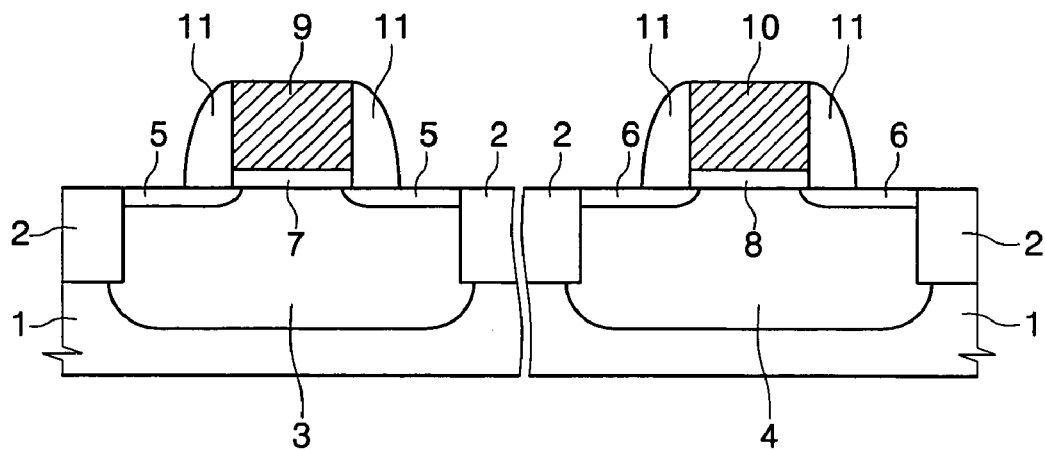
FIGS. 1 and 2 are process cross-sectional views illustrating some processing steps of fabricating a CMOS type semiconductor device having dual polysilicon gates in accordance with the prior art.
Figure 2:
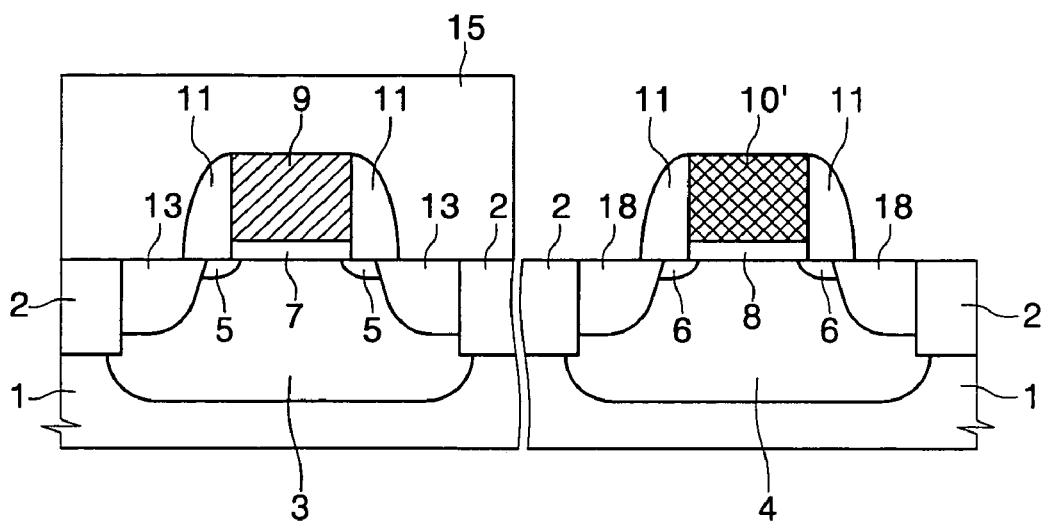

The present invention will now be described more fully hereinafter with reference to the accompanying drawings, in which preferred embodiments of the invention are shown. This invention may, however, be embodied in different forms and should not be construed as being limited to the embodiments set forth herein. Rather, these embodiments are provided so that this disclosure will be thorough and complete, and will fully convey the scope of the invention to those skilled in the art. In the drawings, the thickness of layers and regions are exaggerated for clarity. In addition, when a layer is described to be formed on another layer or on a substrate it means that the layer may be formed on the other layer or on the substrate, or it means that a third layer may be interposed between the layer and the other layer or the substrate. Like numbers refer to like elements throughout the specification.

FIGS. 3 through 13 are cross-sectional views for explaining methods of fabricating a CMOS type semiconductor device having dual gates in accordance with some embodiments of the present invention.

Figure 3:
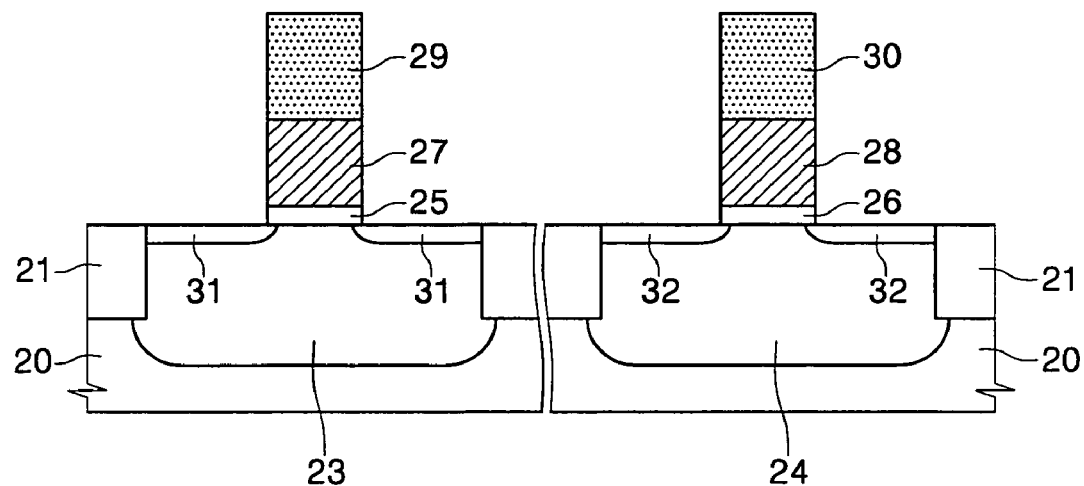
FIGS. 3 to 13 are process cross-sectional views for explaining methods of fabricating a CMOS type semiconductor device having dual gates in accordance with some embodiments of the present invention.

Referring to FIG. 3, a semiconductor substrate 20 having a field isolation layer, a first conductivity type well 23, and a second conductivity type well 24 is first prepared. In particular, isolation layers 21 defining first and second active regions are formed on the semiconductor substrate 20. First conductivity type impurity ions are implanted into the first active region to form the first conductivity type well 23, and second conductivity type impurity ions are implanted into the second active region to form the second conductivity type well 24. The semiconductor substrate 20 may be a single crystalline silicon wafer. The isolation layers 21 may be formed of insulating layers such as high-density plasma (HDP) oxide layers.

The first conductivity type may be a P-type or an N-type. The second conductivity type is opposite to the first conductivity type. That is, the second conductivity type is a P-type when the first conductivity type is an N-type, and the second conductivity type is an N-type when the first conductivity type is a P-type. However, in some embodiments of the present invention, the first conductivity type is a P-type and the second conductivity type is an N-type. As is well known to those skilled in the art, a PMOS transistor may be formed within the N-type well and an NMOS transistor may be formed within the P-type well. A process of implanting impurity ions for forming the first and second conductivity type wells 23 and 24 may be carried out using various angles and energies several times in order to adjust operating voltages Vt of the transistors.

Gate insulating layer patterns 25 and 26, a first gate electrode 27, a second initial gate electrode 28, and hard mask patterns 29 and 30, which are sequentially stacked to cross the wells 23 and 24, are formed on the semiconductor substrate 20 having the wells 23 and 24. In particular, a gate insulating layer, a second conductivity type polysilicon layer, and a hard mask layer are formed on the semiconductor substrate 20 having the wells 23 and 24. The gate insulating layer may comprise a silicon oxide layer. The second conductivity type polysilicon layer may comprise a conductive layer such as a polysilicon layer doped with impurities such as arsenic (As). The hard mask layer may comprise a nitride layer such as a silicon nitride layer using a chemical vapor deposition (CVD) method. The hard mask layer, the second conductivity type polysilicon layer, and the gate insulating layer are sequentially patterned to form the hard mask patterns 29 and 30, the first gate electrode 27, the second initial gate electrode 28, and the gate insulating layer patterns 25 and 26. As a result, the first gate insulating layer pattern 25, the first gate electrode 27, and the first hard mask pattern 29, which are sequentially stacked to cross the first conductivity type well 23, are formed on the first conductivity type well 23. Also, the second gate insulating layer pattern 26, the second initial gate electrode 28, and the second hard mask pattern 30, which are sequentially stacked to cross the second conductivity type well 24, are formed on the second conductivity type well 24. In this case, the first gate electrode 27 and the second initial gate electrode 28 are formed of second conductivity type polysilicon layers.

According to some embodiments of the present invention, the second conductivity type is an N-type. That is, the first gate electrode 27 and the second initial gate electrode 28 may be formed of N-type polysilicon layers.

Subsequently, a first lightly doped drain (LDD) photoresist pattern (not shown) is formed to expose the first conductivity type well 23 and to cover the second conductivity type well 24. Second conductivity type impurity ions may be selectively implanted into the first conductivity type well 23, using the first LDD photoresist pattern and the first hard mask pattern 29 as ion implantation masks, to form first lightly doped impurity regions 31 at both sides of the first gate electrode 27, respectively. According to some embodiments of the present invention, the first lightly doped impurity regions 31 may be N-type.

Subsequently, a second LDD photoresist pattern (not shown) is formed to expose the second conductivity type well 24 and to cover the first conductivity type well 23. First conductivity type impurity ions may be selectively implanted into the second conductivity type well 24, using the second LDD photoresist pattern and the second hard mask pattern 30 as ion implantation masks, to form second lightly doped impurity regions 32 on both sides of the second initial gate electrode 28, respectively. According to some embodiments of the present invention, the second lightly doped impurity regions 32 may be P-type. However, the first and second lightly doped impurity regions 31 and 32 may be omitted.

Figure 4:
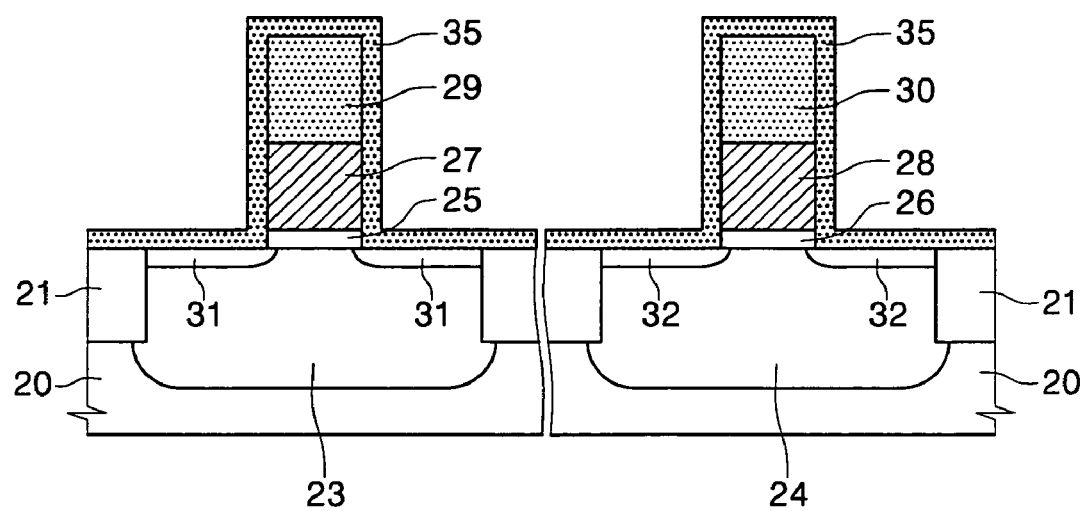

Referring to FIG. 4, a conformal etch stop layer 35 is formed on the semiconductor substrate 20 having the first and second lightly doped impurity regions 31 and 32. The etch stop layer 35 may comprise a material used to form the hard mask patterns 29 and 30. That is, the etch stop layer 35 may be formed of a nitride layer such as a silicon nitride layer.

Figure 5:
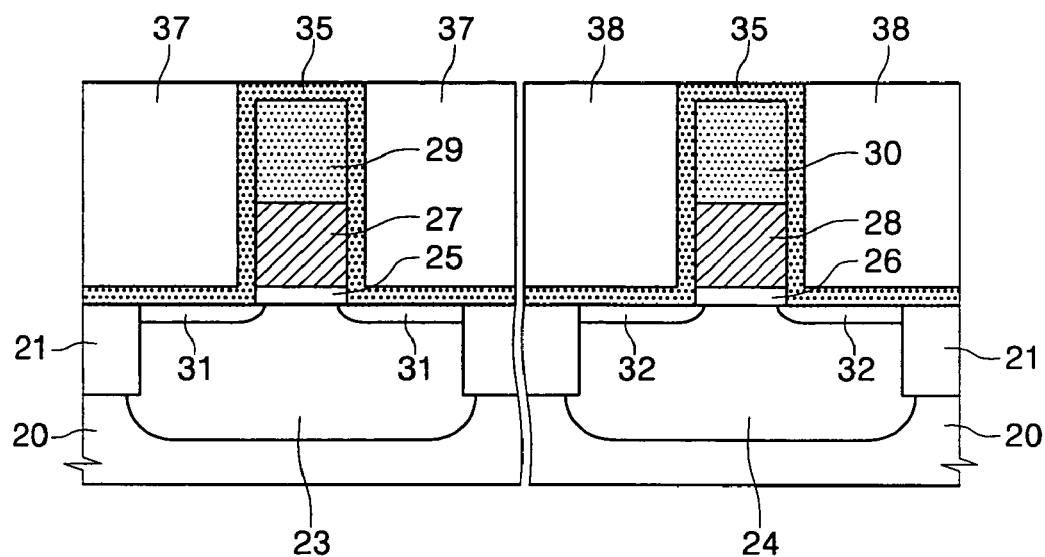

Referring to FIG. 5, an insulating layer such as a boron phosphorous silicate glass (BPSG) layer is formed over the etch stop layer 35. The insulating layer is planarized to concurrently form a first lower interlayer insulating layer 37 on the first conductivity type well 23 and a second lower interlayer insulating layer 38 on the second conductivity type well 24. The process of planarizing the insulating layer may include a chemical mechanical polishing (CMP) process which uses the etch stop layer 35 as an etch stopper. As a result, the etch stop layer 35 above the hard mask patterns 29 and 30 is exposed.

Figure 6:
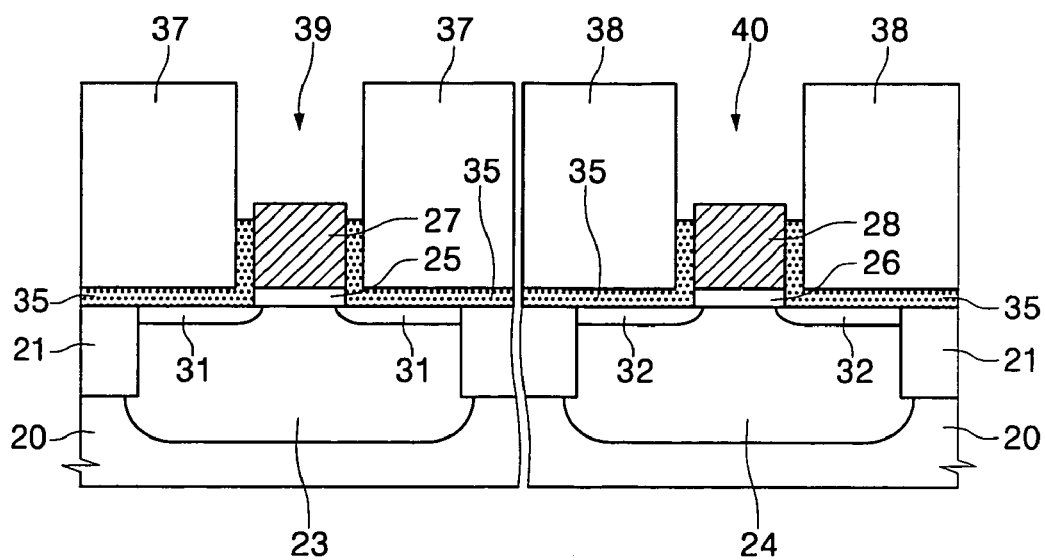

Referring to FIG. 6, the etch stop layer 35 and the hard mask patterns 29 and 30 are etched to concurrently form a first trench 39 exposing a top surface of the first gate electrode 27 on the first conductivity type well 23 and a second trench 40 exposing a top surface of the second initial gate electrode 28 on the second conductivity type well 24. The etching process for forming the first and second trenches 39 and 40 may include a wet etching method using, for example, a phosphoric acid. The phosphoric acid has a high etch selectivity between the BPSG layer and the nitride layer. That is, the etch stop layer 35 and the hard mask patterns 29 and 30 which are formed of the nitride layers can be etched by the phosphoric acid at a faster speed, so that the first and second trenches 39 and 40 may be formed. As a result, the hard mask patterns 29 and 30 may be completely removed, and portions of the etch stop layer 35 may remain on the wells 23 and 24 and also on sidewalls of the gate electrodes 27 and 28.

Figure 7:
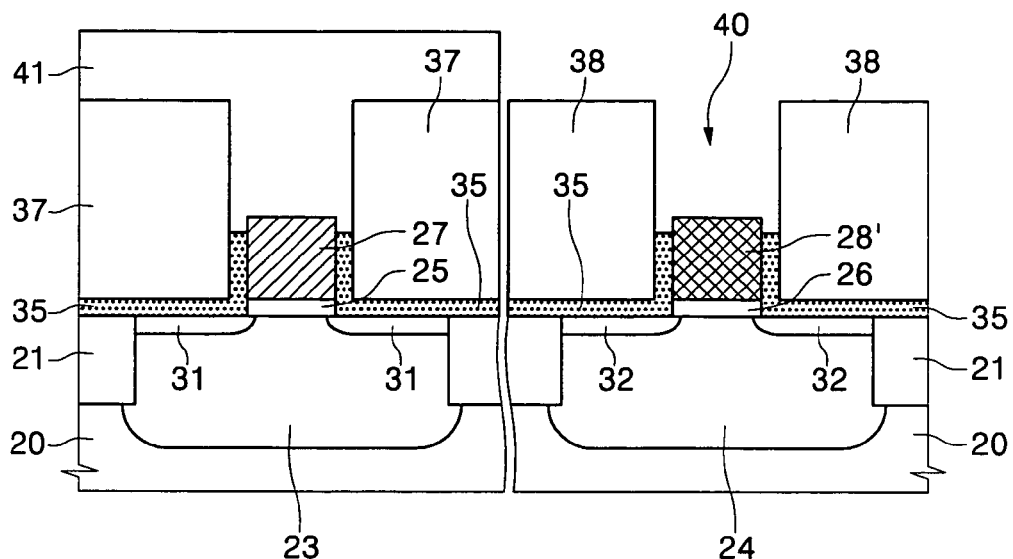

Referring to FIG. 7, a gate photoresist pattern 41 which covers the first conductivity type well 23 and exposes the second conductivity type well 24 is formed on the semiconductor substrate 20 having the first and second trenches 39 and 40. First conductivity type impurity ions are implanted into the second initial gate electrode 28 using the gate photoresist pattern 41 and the second lower interlayer insulating layer 38 as ion implantation masks to thereby form a second gate electrode 28'. According to some embodiments of the present invention, the first conductivity type is a P-type. That is, the second gate electrode 28' may be converted to a P-type polysilicon layer through the process of implanting P-type impurity ions.

Subsequently, the gate photoresist pattern 41 is removed to expose a top surface of the first gate electrode 27 within the first trench 39.

Figure 8:
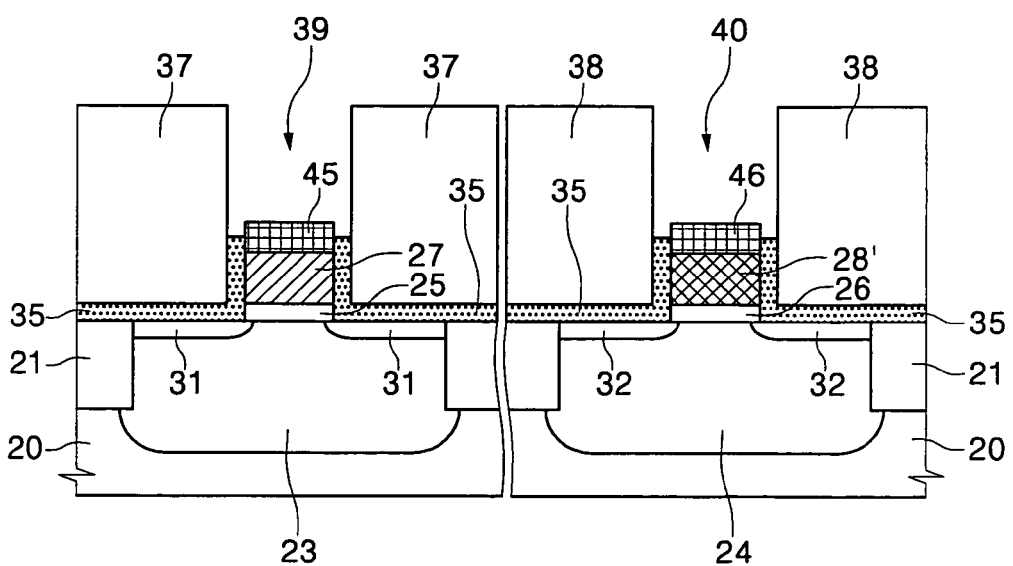

Referring to FIG. 8, a silicidation process is applied to the semiconductor substrate 20 where the top surfaces of the first gate electrode 27 and the second gate electrode 28' are exposed. As a result, a first silicide layer 45 may be formed on the first gate electrode 27 while a second silicide layer 46 may be formed on the second gate electrode 28'. In particular, the silicidation process may include sequentially forming a metal layer and a capping layer on the top surfaces of the first gate electrode 27 and the second gate electrode 28'. The metal layer may be formed of one material chosen from Ni, Co, W, Ta, and Ti, or an alloy containing at least two materials chosen from Ni, Co, W, Ta, and Ti. The metal layer may be formed by a physical vapor deposition (PVD) method. In addition, the capping layer may be formed of a titanium nitride layer (TiN). In this case, the TiN layer acts to prevent the metal layer from being oxidized. However, the formation of the capping layer may be skipped. Subsequently, the semiconductor substrate 20 including the metal layer is annealed. The annealing may be performed at a temperature in a range of about 400° C. to about 500° C. when the metal layer is Ni. Alternatively, the annealing may be divided into primary annealing and secondary annealing. The metal layer reacts with silicon atoms within the first gate electrode 27 and the second gate electrode 28' during the annealing. As a result, the first silicide layer 45 may be formed on the first gate electrode 27 and the second silicide layer 46 may be formed on the second gate electrode 28'. Subsequently, the metal layer which has not been reacted on the semiconductor substrate 20 is removed. The unreacted metal layer may be removed using a mixed solution of sulfuric acid ($H_2SO_4$) and hydrogen peroxide ($H_2O_2$). The capping layer may also be removed while the unreacted metal layer is removed.

Figure 9:
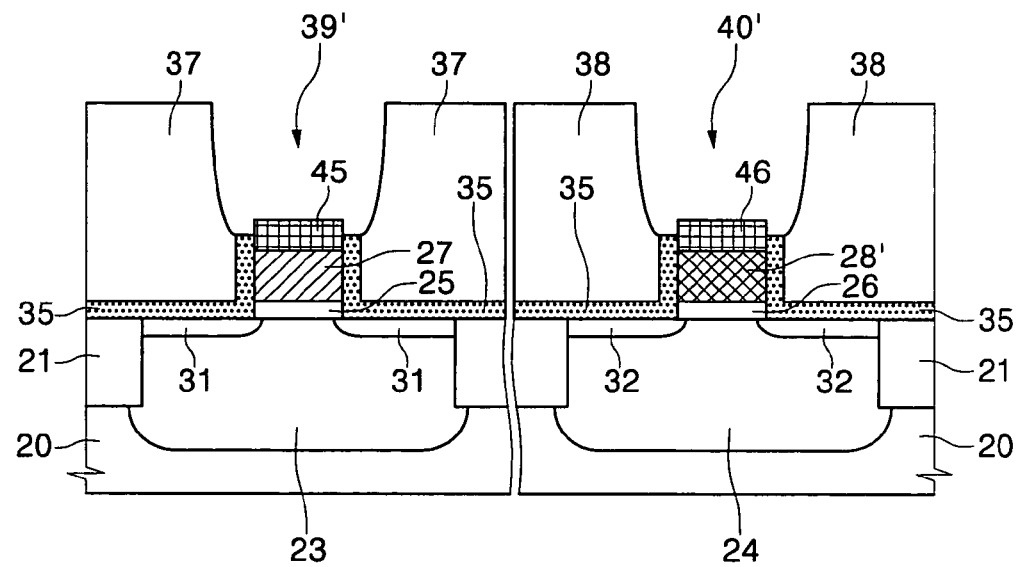

Referring to FIG. 9, the lower interlayer insulating layers 37 and 38 are etched to form first and second extended trenches 39' and 40'. The etching process for forming the first and second extended trenches 39' and 40' may include a wet cleaning process.

Figure 10:
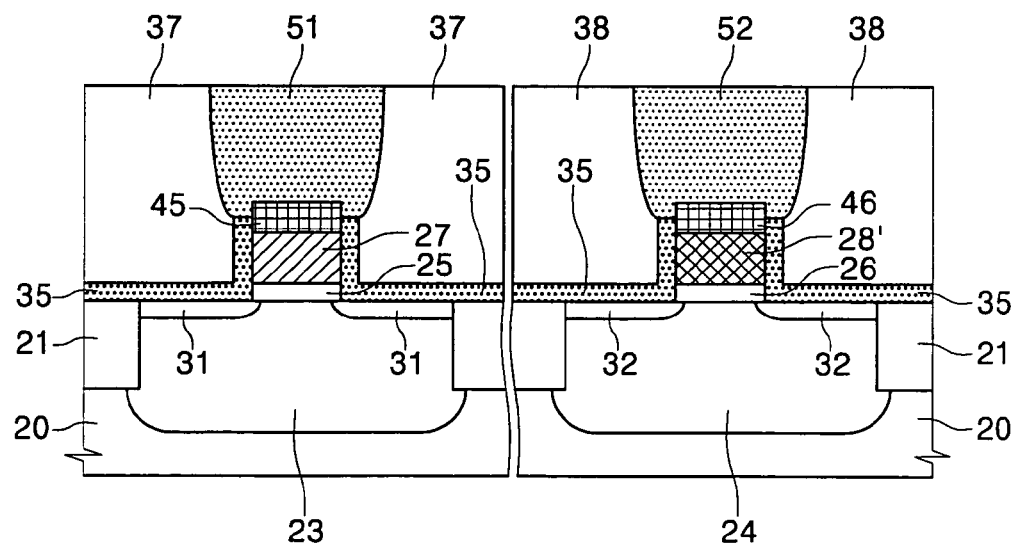

Referring to FIG. 10, a first ion implantation mask pattern 51 and a second ion implantation mask pattern 52 which substantially completely bury the first and second extended trenches 39' and 40' are formed. In particular, a nitride layer such as a silicon nitride layer is formed on the first and second extended trenches 39' and 40' using a CVD method. The nitride layer is preferably deposited to substantially completely bury the first and second extended trenches 39' and 40' and to cover substantially the entire surface of the semiconductor substrate 20. An etch-back process or a planarization process may be then applied to the nitride layer until the top surfaces of the lower interlayer insulating layers 37 and 38 are exposed to form the first ion implantation mask pattern 51 filling the first trench 39' and the second ion implantation mask pattern 52 filling the second trench 40'. As a result, the top surfaces of the lower interlayer insulating layers 37 and 38 and the top surfaces of the ion implantation mask patterns 51 and 52 may be positioned on substantially the same plane. In addition, widths of the ion implantation mask patterns 51 and 52 may be formed to be larger than those of the gate electrodes 27 and 28'.

Figure 11:
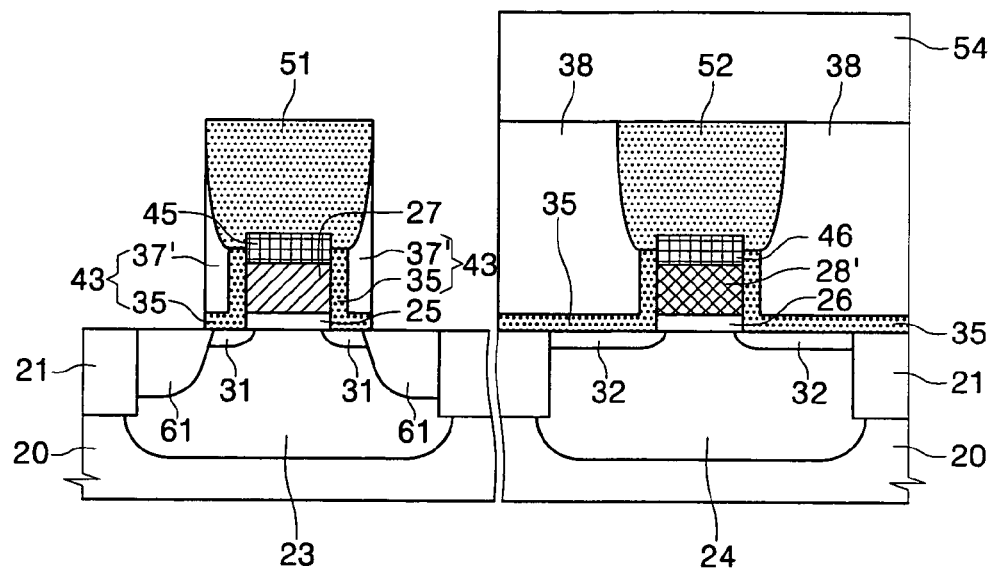

Referring to FIG. 11, a first ion implantation photoresist pattern 54 which exposes the first conductivity type well 23 and covers the second conductivity type well 24 is formed on the semiconductor substrate 20 having the ion implantation mask patterns 51 and 52. The first lower interlayer insulating layer 37 is etched using the first ion implantation photoresist pattern 54 and the first ion implantation mask pattern 51 as etch masks to expose a top surface of the first conductivity type well 23 at both sides of the first gate electrode 27. The etching process for the first lower interlayer insulating layer 37 may include an isotropic etching process or an anisotropic etching process. Alternatively, the etching process for the first lower interlayer insulating layer 37 may include a combined process of the isotropic etching process and the anisotropic etching process. The combined process may be repeated several times.

According to some embodiment of the present invention, when the first lower interlayer insulating layer 37 is a BPSG layer and the first ion implantation mask pattern 51 is a silicon nitride layer, the anisotropic etching process for the first lower interlayer insulating layer 37 may include a dry etching technique having a high etch selectivity between the BPSG layer and the silicon nitride layer. In this case, a portion 37' of the first lower interlayer insulating layer 37 may remain on sidewalls of the first gate electrode 27. As a result, a first insulating spacer 43 may include the portion 37' of the first lower interlayer insulating layer 37 and the etch stop layer 35, which are sequentially stacked on the sidewalls of the first gate electrode 27. Alternatively, the first insulating spacer 43 may be formed of only the etch stop layer 35.

In addition, the etch stop layer 35 may remain on a top surface of the first conductivity type well 23 after the etching process for the first lower interlayer insulating layer 37 is carried out. The etch stop layer 35 may be removed using a cleaning process.

Subsequently, second conductivity type impurity ions are implanted into the exposed surface of the first conductivity type well 23 using the first ion implantation photoresist pattern 54 and the first ion implantation mask pattern 51 as ion implantation masks to form first source and drain regions 61. In this case, the amount of the second conductivity type impurity ions for forming the first source and drain regions 61 may be different from the doped level of the first gate electrode 27. For example, even when the second conductivity type impurity ions of high concentration are implanted into the exposed surface of the first conductivity type well 23, the concentration of impurity ions of the first gate electrode 27 protected by the first ion implantation mask pattern 51 may not be changed.

According to some embodiments of the present invention, the second conductivity type is an N-type. That is, the first source and drain regions 61 may be N-types. After the first source and drain regions 61 are formed, the first lightly doped impurity regions 31 having the second conductivity type may remain below the first insulating spacer 43. Accordingly, the first source and drain regions 61 and the first lightly doped impurity regions 31 may be electrically coupled to each other. The first ion implantation photoresist pattern 54 is then removed.

Figure 12:
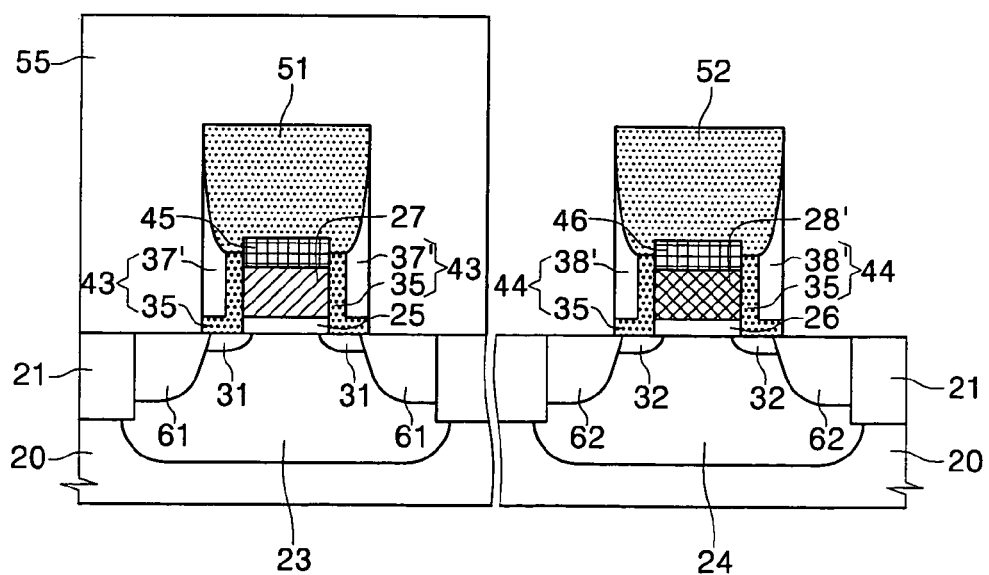

Referring to FIG. 12, a second ion implantation photoresist pattern 55 which covers the first conductivity type well 23 and exposes the second conductivity type well 24 is formed on the semiconductor substrate 20 having the first source and drain regions 61. The second lower interlayer insulating layer 38 is etched, using the second ion implantation photoresist pattern 55 and the second ion implantation mask pattern 52 as an etch mask, to expose a top surface of the second conductivity type well 24 at both sides of the second gate electrode 28'. The etching process for the second lower interlayer insulating layer 38 may include an isotropic etching process or an anisotropic etching process. Alternatively, the etching process for the second lower interlayer insulating layer 38 may include a combined process of the isotropic etching process and the anisotropic etching process and perform the combined process several times.

According to some embodiment of the present invention, when the second lower interlayer insulating layer 38 is a BPSG layer and the second ion implantation mask pattern 52 is a silicon nitride layer, the anisotropic etching process for the second lower interlayer insulating layer 38 may include a dry etching technique having a high etch selectivity between the BPSG layer and the silicon nitride layer. In this case, a portion 38' of the second lower interlayer insulating layer 38 may remain on sidewalls of the second gate electrode 28'. As a result, a second insulating spacer 44 include the portion 38' of the second lower interlayer insulating layer 38 and the etch stop layer 35 which are sequentially stacked on the sidewalls of the second gate electrode 28'. Alternatively, the second insulating spacer 44 may be formed of only the etch stop layer 35.

In addition, the etch stop layer 35 may remain on a top surface of the second conductivity type well 24 after the etching process for the second lower interlayer insulating layer 38 is carried out. The etch stop layer 35 may be removed using a cleaning process.

Subsequently, first conductivity type impurity ions are implanted into the exposed surface of the second conductivity type well 24, using the second ion implantation photoresist pattern 55 and the second ion implantation mask pattern 52 as an ion implantation mask, to form second source and drain regions 62. The first conductivity type may be a P-type. That is, the second source and drain regions 62 may be P-types. In this case, the P-type impurity ions may include boron (B) or boron fluoride ($BF_2$). In addition, the amount of the first conductivity type impurity ions for forming the second source and drain regions 62 may be different from that of the ions implanted when the second gate electrode 28' is formed. For example, even when the boron (B) or the boron fluoride ($BF_2$) of high concentration are implanted into the exposed surface of the second conductivity type well 24, the concentration of impurity ions of the second gate electrode 28' protected by the second ion implantation mask pattern 52 may not be changed.

After the second source and drain regions 62 are formed, the second lightly doped impurity regions 32 having the first conductivity type may remain below the second insulating spacer 44. Accordingly, the second source and drain regions 62 and the second lightly doped impurity regions 32 may be electrically connected to each other. The second ion implantation photoresist pattern 55 is then removed.

Figure 13:
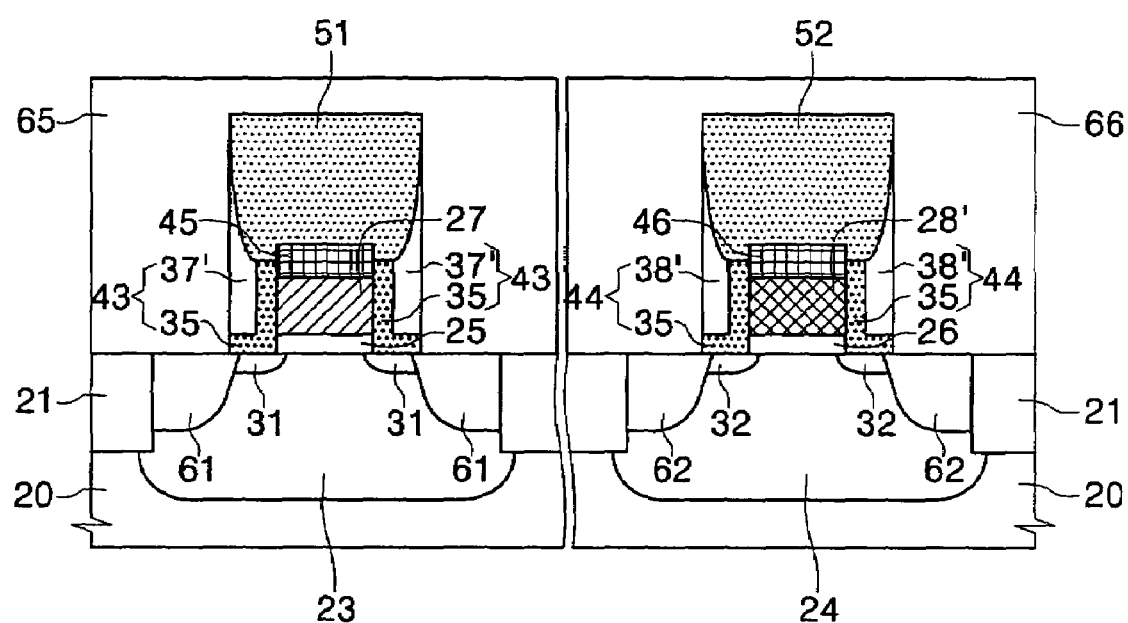

Referring to FIG. 13, upper interlayer insulating layers 65 and 66 are formed on the semiconductor substrate 20 having the first source and drain regions 61 and the second source and drain regions 62. The upper interlayer insulating layers 65 and 66 may be formed of an insulating layer such as a BPSG layer.

A typical process technique such as formation of a source and drain contact plug may be then employed to fabricate the CMOS type semiconductor device having dual gates.

According to some embodiments of the present invention as mentioned above, an N-type doped polysilicon gate electrode is first formed on an N-type well. And P-type impurity ions are selectively implanted into the N-type doped polysilicon gate electrode, which is converted to a P-type polysilicon gate electrode. Subsequently, an ion implantation mask pattern is formed on the P-type polysilicon gate electrode. P-type impurity ions are implanted into an exposed surface of the N-type well using the ion implantation mask pattern as an ion implantation mask to form source and drain regions. The amount of the P-type impurity ions for forming the source and drain regions may be different from that of the ions implanted when the P-type polysilicon gate electrode is formed. That is, even when the boron (B) or the boron fluoride ($BF_2$) of high concentration is implanted into the exposed surface of the N-type well, the concentration of impurity ions of the P-type polysilicon gate electrode protected by the ion implantation mask pattern may not be changed.

In conclusion, the CMOS type semiconductor device having dual polysilicon gates may be implemented while the boron (B) penetration phenomenon is effectively controlled.

Preferred embodiments of the present invention have been disclosed herein and, although specific terms are employed, they are to be used and are to be interpreted in a generic and descriptive sense only and not for purpose of limitation. Accordingly, it will be understood by those of ordinary skill in the art that various changes in form and details may be made without departing from the spirit and scope of the present invention as set forth in the following claims.

What is claimed is:

1. A method of fabricating a complementary metal oxide semiconductor (CMOS) type semiconductor device, the method comprising:
   providing a semiconductor substrate having a field isolation layer, a first conductivity type well, and a second conductivity type well;
   forming an insulated first gate electrode on the first conductivity type well, and an insulated second initial gate electrode on the second conductivity type well;
   forming a first lower interlayer insulating layer exposing a top surface of the first gate electrode on the first conductivity type well, and a second lower interlayer insulating layer exposing a top surface of the second initial gate electrode on the second conductivity type well;
   implanting first conductivity type impurity ions into the second initial gate electrode to form a second gate electrode;
   forming a first ion implantation mask pattern over the first gate electrode, and a second ion implantation mask pattern over the second gate electrode;
   etching the first lower interlayer insulating layer to expose a top surface of the first conductivity type well at both sides of the first gate electrode;
   implanting second conductivity type impurity ions into the first conductivity type well, using the first ion implantation mask pattern as an ion implantation mask, to form first source and drain regions at both sides of the first gate electrode;
   etching the second lower interlayer insulating layer, using the second ion implantation mask pattern as an etch mask, to expose a top surface of the second conductivity type well at both sides of the second gate electrode; and
   implanting first conductivity type impurity ions into the second conductivity type well, using the second ion implantation mask pattern as an ion implantation mask, to form second source and drain regions at both sides of the second gate electrode.

2. The method as recited in claim 1, wherein the first conductivity type is any one of a P-type and an N-type, and the second conductivity type is an N-type when the first conductivity type is a P-type, and the second conductivity type is a P-type when the first conductivity type is an N-type.

3. The method as recited in claim 2, wherein the P-type impurity ions include boron (B) or boron fluoride ($BF_2$).

4. The method as recited in claim 1, wherein the first conductivity type is a P-type, and the second conductivity type is an N-type.

5. The method as recited in claim 1, wherein the first gate electrode and the second initial gate electrode are formed of second conductivity type polysilicon layers.

6. The method as recited in claim 1, wherein the first gate electrode and the second initial gate electrode are formed of N-type polysilicon layers.

7. The method as recited in claim 1, wherein exposing the top surface of the first gate electrode and the top surface of the second initial gate electrode includes:
   forming a first hard mask pattern on the first gate electrode, and a second hard mask pattern on the second initial gate electrode;
   forming a conformal etch stop layer on the semiconductor substrate having the first and second hard mask patterns;
   forming a first lower interlayer insulating layer on the first conductivity type well to expose the etch stop layer on the first hard mask pattern, and a second lower interlayer insulating layer on the second conductivity type well to expose the etch stop layer on the second hard mask pattern; and
   etching the etch stop layer, the first hard mask pattern, and the second hard mask pattern.

8. The method as recited in claim 2, wherein the P-type impurity ions are implanted into the second initial gate electrode when the second gate electrode is formed by implanting first conductivity type impurity ions into the second initial gate electrode.

9. The method as recited in claim 1, further comprising applying a silicidation process on the semiconductor substrate having the first gate electrode and the second gate electrode to form a first silicide layer on the first gate electrode and a second silicide layer on the second gate electrode.

10. The method as recited in claim 1, wherein a width of the first ion implantation mask pattern is larger than that of the first gate electrode while a width of the second ion implantation mask pattern is larger than that of the second gate electrode.

11. The method as recited in claim 1, wherein the first and second ion implantation mask patterns are formed of nitride layers.

12. The method as recited in claim 1, wherein exposing the top surface of the first conductivity type well includes:
    forming a first ion implantation photoresist pattern for exposing a top surface of the first conductivity type well and covering a top surface of the second conductivity type well on the semiconductor substrate having the first lower interlayer insulating layer and the first ion implantation mask pattern; and
    etching the first lower interlayer insulating layer, using the first ion implantation photoresist pattern and the first ion implantation mask pattern as an etch mask.

13. The method as recited in claim 1, further comprising forming a first insulating spacer on a sidewall of the first gate electrode.

14. The method as recited in claim 13, wherein the first insulating spacer includes a portion of the first lower interlayer insulating layer and the etch stop layer.

15. The method as recited in claim 1, wherein exposing the top surface of the second conductivity type well includes:
    forming a second ion implantation photoresist pattern for covering a top surface of the first conductivity type well and exposing a top surface of the second conductivity type well on the semiconductor substrate having the second lower interlayer insulating layer and the second ion implantation mask pattern; and
    etching the second lower interlayer insulating layer, using the second ion implantation photoresist pattern and the second ion implantation mask pattern as an etch mask.

16. The method as recited in claim 1, further comprising forming a second insulating spacer on a sidewall of the second gate electrode.

17. The method as recited in claim 16, wherein the second insulating spacer includes a portion of the second lower interlayer insulating layer and the etch stop layer.

18. The method as recited in claim 1, wherein an amount of the first conductivity type impurity ions for forming the second source and drain regions is different from that of the first conductivity type impurity ions implanted when the second initial gate electrode is converted to the second gate electrode.

19. A method of fabricating a complementary metal oxide semiconductor (CMOS) type semiconductor device, the method comprising:
    providing a semiconductor substrate having an isolation layer, a P-type well, and an N-type well;
    forming an insulated first gate electrode on the P-type well, and an insulated second initial gate electrode on the N-type well;
    forming a first lower interlayer insulating layer exposing a top surface of the first gate electrode on the P-type well, and a second lower interlayer insulating layer exposing a top surface of the second initial gate electrode on the N-type well;
    implanting P-type impurity ions into the second initial gate electrode to form a second gate electrode;
    forming a first silicide layer on the first gate electrode and a second silicide layer on the second gate electrode;
    forming a first ion implantation mask pattern over the first silicide layer, and a second ion implantation mask pattern over the second silicide layer;
    etching the first lower interlayer insulating layer to expose a top surface of the P-type well at both sides of the first gate electrode;
    implanting N-type impurity ions into the P-type well, using the first ion implantation mask pattern as an ion implantation mask, to form first source and drain regions at both sides of the first gate electrode;
    etching the second lower interlayer insulating layer, using the second ion implantation mask pattern as an etch mask, to expose a top surface of the N-type well at both sides of the second gate electrode; and
    implanting P-type impurity ions into the N-type well, using the second ion implantation mask pattern as an ion implantation mask, to form second source and drain regions at both sides of the second gate electrode.

20. The method as recited in claim 19, wherein an amount of the P-type impurity ions for forming the second source and drain regions is different from that of the P-type impurity ions implanted when the second initial gate electrode is converted to the second gate electrode.

* * * * *